United States Patent [19]

Proebsting et al.

[11] 4,061,999
[45] Dec. 6, 1977

[54] DYNAMIC RANDOM ACCESS MEMORY SYSTEM

[75] Inventors: Robert J. Proebsting, Richardson; Paul R. Schroeder, Dallas, both of Tex.

[73] Assignee: Mostek Corporation, Carrollton, Tex.

[21] Appl. No.: 644,857

[22] Filed: Dec. 29, 1975

[51] Int. Cl.² .............................................. G11C 11/40
[52] U.S. Cl. .................................. 365/182; 307/238; 365/202; 365/203
[58] Field of Search ..... 340/173 R, 173 FF, 173 DR; 307/238, 279

[56] References Cited
U.S. PATENT DOCUMENTS 3,641,511  2/1972  Cruchi ............................. 340/173 R Primary Examiner—Terrell W. Fears
Attorney, Agent, or Firm—Hubbard, Thurman, Turner & Tucker

[57] ABSTRACT

An integrated circuit MOSFET dynamic random access memory is disclosed which utilizes a plurality of memory cells arrayed in rows and columns. One-half of the cells in each column are connected to a true digit line and the other half are connected to a complement digit line. The true and complement digit lines are each connected through a separate transistor, which functions as a varible resistance, to true and complement input nodes of a sense amplifier. The sense amplifier is comprised of a transistor connecting each input node to a latch node, with the gates of the transistors cross coupled to the opposite input nodes. The digit lines are precharged to equal voltages corresponding to $V_{DD}$. When enabled by an address signal, a storage cell is connected to one of the digit lines at the same time a dummy cell is connected to the other line. As a result, one of the digit lines has a slightly higher voltage than the other. The first set of transistors permit the latching node to be very rapidly brought to ground in order to completely discharge the digit line having the lower voltage, while maintaining substantially the initial high voltage on the other digit line. The common gate nodes of the first transistors are precharged to the drain supply voltage when one of the true or complement digit lines in each column is low and then isolated to provide bootstrapping above $V_{DD}$ when the digit lines are subsequently precharged to the drain supply voltage of the system. The split digit lines are precharged from a common node through a first pair of transistors, with the common node being charged through a third transistor. The third transistor is turned off before the first pair of transistors to prevent noise in the drain supply voltage from resulting in uneven voltage precharges on the split data lines.

20 Claims, 3 Drawing Figures

DYNAMIC RANDOM ACCESS MEMORY SYSTEM

This invention relates generally to dynamic random access memories formed on MOSFET type large scale integrated circuits, and more particularly relates to a system having dynamic balanced sense amplifiers and both read and write capability.

It is presently known in the industry how to fabricate dynamic random access read/write memories using MOSFET integrated circuit technology. These circuits typically utilize 4,096 or 16,384 storage cells each comprised of a capacitive storage node and a single transistor connecting the node to a column or digit line. For a 4096 bit system, the storage cells are typically arranged in an array of 64 rows and 64 columns. Data is stored in the cell by charging the digit line to either ground potential or a voltage somewhat less than the drain supply voltage, while momentarily turning the transistor on by bringing a row enable line high to store the voltage of the digit line on the storage node. A logic "0" is stored when the voltage on the node is less than some selected voltage between the drain supply voltage, typically +12 volts, and the source supply voltage or ground, and a logic "1" when the stored voltage is greater than the selected voltage. A typical value for the arbitrary voltage level is about 5 volts. Data is read from a storage cell by first precharging the digit bus to some voltage, and then after termination of the precharge, turning the transistor connecting the cell to the digit bus on. If a logic "0" is stored on the node, the voltage of the column bus is decreased by a greater amount or increased by a lesser amount than when a logic "1" is stored. These two ultimate levels of voltage on the digit bus are then discriminated by a sense amplifier to read the logic "1" or logic "0" from the cell.

One method for discriminating between the different voltage changes on the digit line is described in U.S. Pat. No. 3,969,706. This method samples the voltage on the digit line before the cell is addressed and compares this sampled voltage with the voltage on the digit line after the cell is addressed. This system has proven successful and has been commercially employed. Another approach to the problem is typified by U.S. Pat. Nos. 3,588,844, and 3,514,765, issued to Christensen. In this system, the digit line is divided into equal parts and connected to a balanced amplifier. This type of system has been employed by various workers in the art with varying degrees of success. However, various embodiments of this type system have heretofore alternatively consumed D.C. power, or has required an unreasonable period of time for precharge, or has alternatively required an unreasonable period of time to read data, or has resulted in an unacceptably low level voltage on the digit bus which should remain high, or has required additional means to restore the digit bus to an appropriately high level, or has alternatively required a larger signal and, hence, a larger storage cell for proper sensing.

The present invention is concerned with an improved memory system having the advantages of split digit lines connected to a balanced amplifier, and yet which has improved speed as a result of both a short precharge period and a short read time. In addition, the system consumes no D.C. power and is capable of high sensitivity detection. In accordance with the invention, true and complement digit lines are connected through resistances to input nodes of an amplifier comprised of cross coupled transistors connecting each of the input nodes to a latching node. In the preferred form, the input resistors are transistors the gates of which are common. The digit lines are precharged to the drain supply voltage, while the gates of the input transistors are bootstrapped to a voltage above the drain supply voltage to permit the differential voltage of the digit lines to be transferred to the input nodes of the sense amplifiers. The latching node is then transitioned to ground at a progressively greater rate to allow discharge of one of the digit lines while substantially maintaining the drain supply voltage on the other digit line. The resistance provided by the transistors is greatest as the voltage on the latching node is started down so that the input node of the amplifier which starts out at the lower voltage level can be quickly discharged without first having to discharge the relatively large capacitance to the digit line to which it is attached. As a result, the cross coupled transistors are more quickly latched to prevent any significant discharge of the other digit line which had the higher initial voltage level. Yet as the voltage on the input node being discharged decreases, the resistance of the transistor progressively decreases to quickly discharge the digit line which had the initial lower voltage.

A unique method of charging the digit lines is also provided to substantially eliminate adverse effects from noise in the voltage supply, and a unique system for controlling the voltage on the gates of the resistive transistors is also provided.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figures 1, 2:
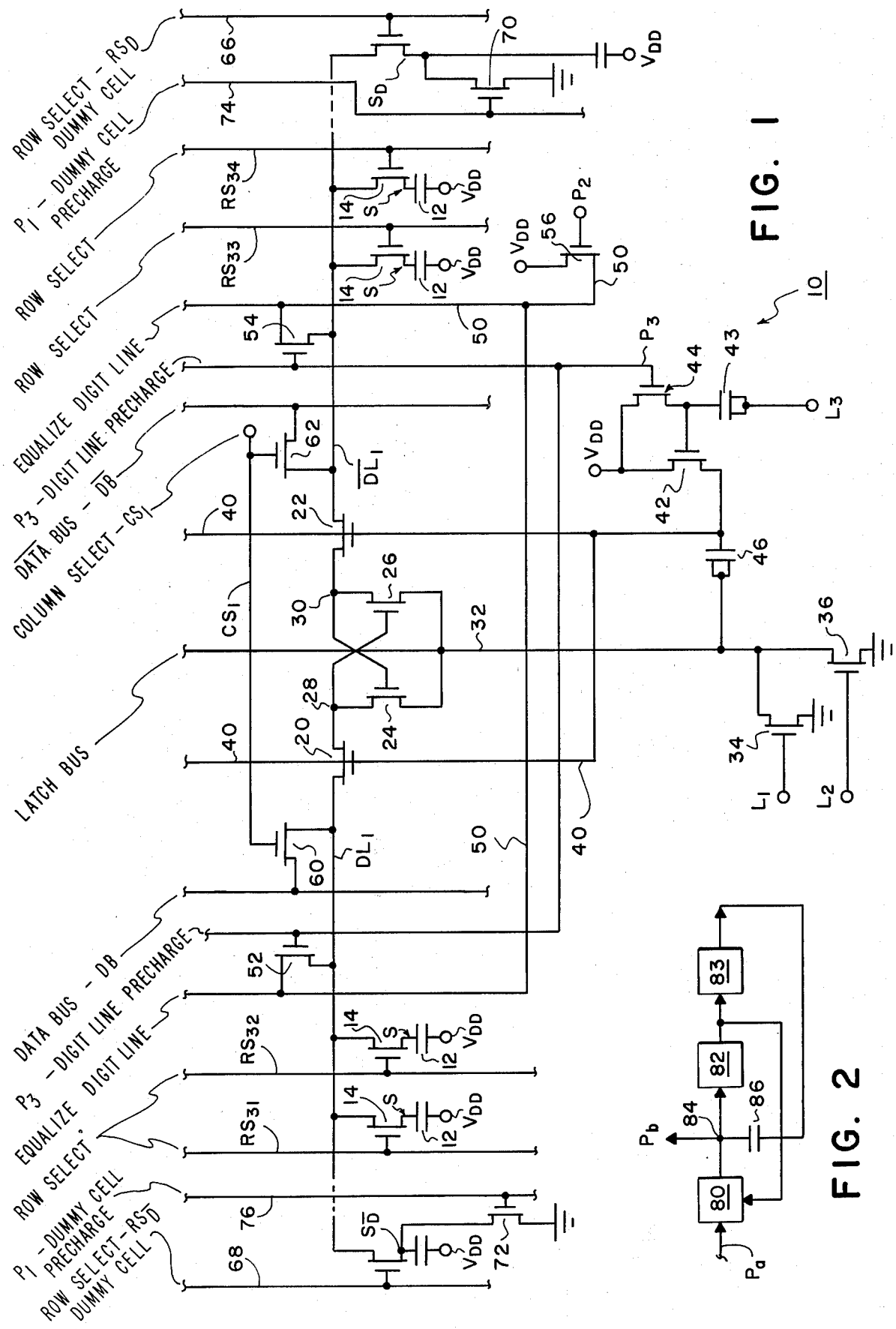
FIG. 1 is a schematic circuit diagram of a dynamic random access memory system in accordance with the present invention.
FIG. 2 is a schematic diagram illustrating a typical subcomponent used to operate a portion of the circuit of FIG. 1.

Referring now to the drawings, a portion of a dynamic random access memory in accordance with the present invention is indicated generally by the reference numeral 10 in FIG. 1. The system 10 may typically include 4,096 or 16,384 binary storage cells formed on a single integrated circuit which also includes the appropriate control circuitry. The control circuit not herein disclosed in detail may be any prior art circuitry such as that described in U.S. Pat. No. 3,969,706, the terms of which are hereby incorporated by reference. Four of the storage cells are indicated by the reference character S in FIG. 1. Each storage cell is comprised of a capacitive storage node 12 and a field effect transistor 14 which are connected in series between a digit line $DL_1$ or $\overline{DL_1}$ and $V_{DD}$ i.e. the drain supply voltage.

Storage cells S are arrayed in equal numbers of rows and columns, typically 64, for a 4,096 bit system, and 128 for a 16,384 bit system. For ease of discussion, only the first column of storage cells will be discussed, although it will be understood that another 63 columns of identical configurations would be provided in a typical system. Half of the 64 storage cells S arrayed in each column are connected to a true digit line $DL_1$ and the other half are connected to a complement digit line $\overline{DL_1}$ as illustrated in FIG. 1. Each of the digit lines $DL_1$ and $\overline{DL_1}$ are the same geometric configuration and are connected to the same number of storage cells S. In addition, a dummy cell $\overline{SD}$ is connected to digit line $DL_1$ and another dummy cell SD is connected to digit line $\overline{DL_1}$ to establish a reference voltage on one of the digit lines as will presently be described. The gates of all of the storage cells S in a common row are connected to a row select line RS. Row select lines $RS_{31} - RS_{34}$ are illustrated in FIG. 1. Of course, it will be understood that row select lines $RS_1 - RS_{30}$ and $RS_{35} - RS_{64}$ have been omitted in order to simplify the illustrations.

The true digit line $DL_1$ is connected to the true input node 28 of a latching differential amplifier by the channel of a first transistor 20 and complement digit line $\overline{DL_1}$ is connected to the complement input node 30 of the differential amplifier by the channel of a second transistor 22. The latching differential amplifier includes third and forth transistors 24 and 26, which connect input nodes 28 and 30 to a latch bus 32. The gate of the third transistor 24 is cross coupled to the complement input node 30 and the gate of the fourth transistor 26 is cross coupled to the true input node 28. The latch bus 32 is pulled toward ground at a relatively slow rate when transistor 34 is turned on by clock signal $L_1$, and at a much faster rate when transistor 36 is turned on by clock signal $L_2$ because transistor 36 is substantially larger than transistor 34. Clock $L_1$ goes high slightly before $L_2$ for purposes which will presently be described in connection with FIG. 3.

The gates of all transistors 20 and 22 for the 64 column lines are connected to a common node 40 which may be precharged to $V_{DD}$ through transistor 42. The gate of transistor 42 is connected to $V_{DD}$ through transistor 44, the gate of which is controlled by precharge signal $P_3$. The gate of transistor 42 is capacitively boosted above $V_{DD}$ by capacitor 43 connected to clock pulse $L_3$ which occurs after transistor 44 has been turned off by precharge clock $P_3$ as will presently be described. Node 40 is capacitively coupled to latch bus 32 by capacitor 46 to assist the stray capacitance of transistors 20 and 22 in driving node 40 above $V_{DD}$ as will presently be described.

The true and complement digit lines DL and $\overline{DL}$ of all 64 columns are precharged from node 50 through transistors 52 and 54, the gates of which are controlled by the common precharge signal $P_3$. Node 50 is driven to $V_{DD}$ through a transistor 56, the gate of which is controlled by precharge signal $P_2$ which goes above $V_{DD}$. Data may be written in an addressed cell, or read from an addressed cell by true and complement data buses DB and $\overline{DB}$ and column select transistors 60 and 62, respectively, the gates of which are controlled by a column select line $CS_1$.

Dummy cells SD and $\overline{SD}$ each have a capacitance approximately one-half the capacitance of a data storage cell S. All dummy cells SD are enabled by line 66 whenever any one of the row select lines $RS_1 - RS_{32}$ associated with digit line $DL_1$ is active. Similarly, dummy cell $\overline{SD}$ is enabled by circuit line 68 whenever any row select line associated with digit line $\overline{DL_1}$ is active. The storage node of dummy cell SD is precharged to ground potential through transistor 70, and the storage node of dummy cell $\overline{SD}$ is precharged to ground potential through transistor 72 when precharge signal $P_1$ applied to lines 74 and 76 is high as will presently be described.

Precharge clock signals $P_2$ and $P_3$ both require voltages above the drain supply voltage $V_{DD}$ for satisfactory operation of the circuit as will hereafter be described in greater detail. The supply voltage $V_{DD}$ is usually the maximum externally generated supply voltage available in the circuits and in the commercial embodiment of the present invention is +12 volts, since N-channel silicon gate process technology is employed. It is desired for $P_2$ and $P_3$ to have high levels of approximately +16 volts. A suitable system for producing a clock voltage greater than the drain supply voltage $V_{DD}$ is illustrated schematically in FIG. 2. This system is described in detail and claimed in co-pending U.S. application Ser. No. 644,855 now U.S. Pat. No. 3,969,706, entitled "Clock Generator and Delay Stage," filed December 29, 1975, by Paul R. Schroeder and Robert J. Proebsting, and assigned to the assignee of the present invention. This system utilizes a plurality of delay stages 80, 82 and 83. The output from delay stage 80 is applied to the input of a delay stage 82, the output of which is applied to a third delay stage 83. The output of delay stage 82 is fed back to delay stage 80 to isolate the output node 84 from stage 80. The output of stage 83 is capacitively coupled to node 84 by capacitor 86. Thus as a result of a precharge timing signal $P_4$ to delay stage 80, node 84 is first driven substantially to $V_{DD}$ after one delay period. A short time later, the output of delay stage 82 turns the output of delay stage 80 off, thus isolating the voltage on node 84. Then when the output of delay stage 83 subsequently goes to $V_{DD}$ node 84 is capacitively boosted above $V_{DD}$. This circuitry easily provides an output of 16 volts from a supply voltage $V_{DD}$ of 12 volts. Other suitable systems may be employed to produce the precharge clock signals $P_2$ and $P_3$ above $V_{DD}$.

Figure 3:
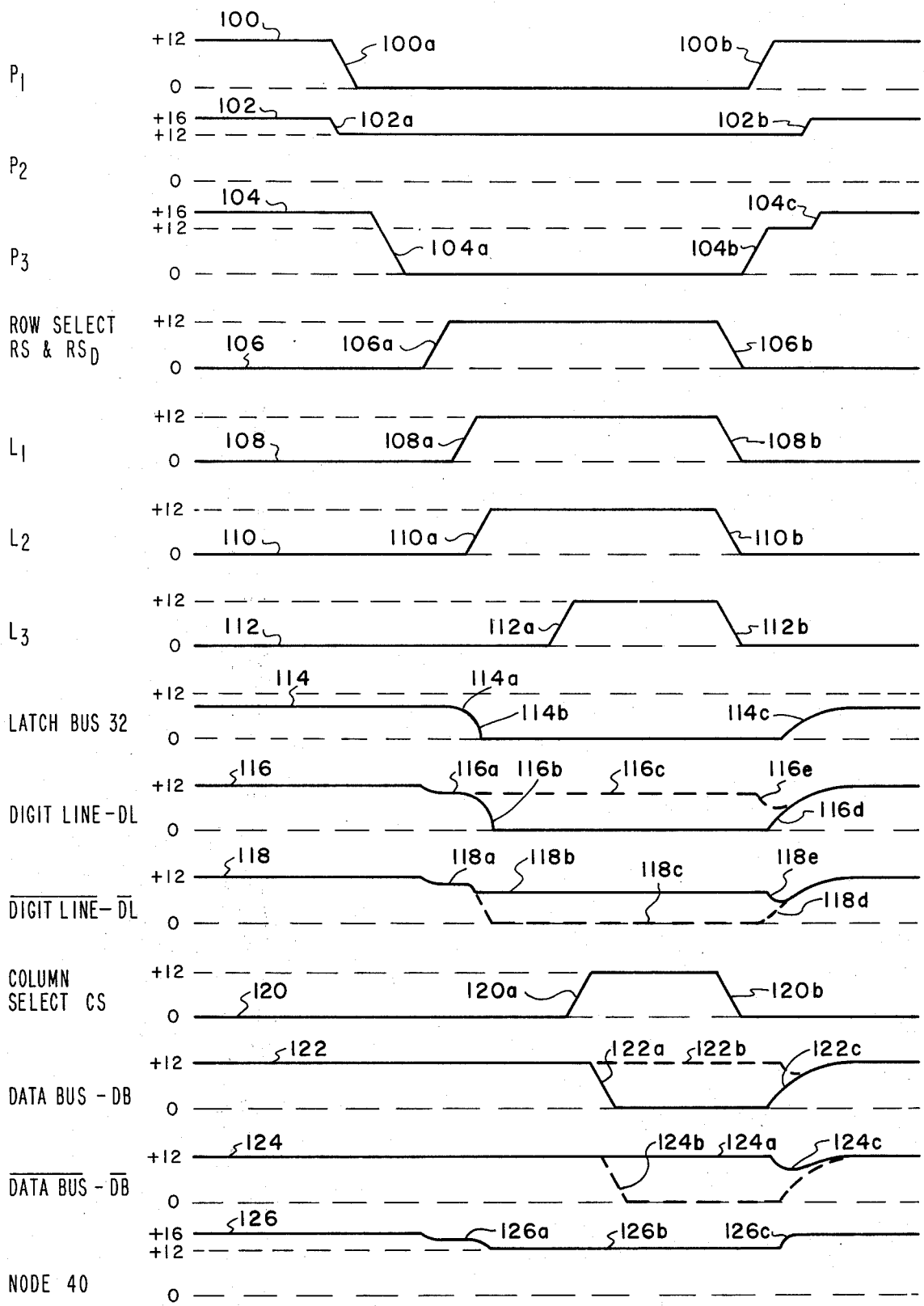
FIG. 3 is a timing diagram which serves to illustrate the operation of the circuit of FIG. 1.

The operation of the circuit of FIG. 1 may best be understood by referring to the timing diagram of FIG. 3. FIG. 3 illustrates the voltage with respect to time of precharge signals $P_1$, $P_2$ and $P_3$ by means of time lines 100, 102 and 104, respectively. The voltage on the one active row select line $RS_1$ through $RS_{64}$ and also the appropriate dummy cell enable line $RS_D$ or $RS_{\overline{D}}$ is indicated by time line 106. All other row select lines $RS_1$ through $RS_{64}$ and the other dummy cell enable line remain at ground potential. Latch clock signals $L_1$, $L_2$, and $L_3$ are indicated by time lines 108, 110, and 112, respectively. The voltage resulting on latch bus 32 is represented by time 114, and the voltage resulting on the true and complement digit lines DL and $\overline{DL}$ are represented by time lines 116 and 118 respectively. The voltage on the addressed column select line CS is represented by time line 120, and the resulting voltages on the true data bus DB and the complement data bus $\overline{DB}$ are represented by time lines 122 and 124, respectively.

During the precharge period, i.e, the period between active cycles, precharge signal $P_1$ is at $V_{DD}$, i.e., +12 volts, and precharge signals $P_2$ and $P_3$ are above $V_{DD}$ at +16 volts. As a result of $P_1$ being high, transistors 70 and 72 are turned on to discharge the nodes of dummy cells SD and $\overline{SD}$ to ground or 0 volts. $P_2$ is at +16 volts so that transistor 56 is turned on and node 50 is charged fully to $V_{DD}$. The digit line precharge $P_3$ is at +16 volts so that digit lines DL and $\overline{DL}$ are all charged to +12 volts as indicated by lines 116 and 118 in FIG. 3.

As will hereafter be more evident, node 40, which is represented by time line 126 in FIG. 3, is at +16 volts as a result of capacitive coupling through the gates of transistors 20 and 22 of all 64 columns and also capacitor 46. In this regard, it will be appreciated that transistor 42 is non-conductive even though node 40 has been bootstrapped above $V_{DD}$ because its gate and effective source node in this condition are both at $V_{DD}$. Since $V_{DD}$ is applied to the gates of both transistors 24 and 26, the latch bus 32 will be precharged to $V_{DD}$ less one threshold, or about +10 volts.

At the start of an active cycle, precharge clock $P_1$ goes from +12 volts to ground, as represented by event 100a, so as to turn transistors 70 and 72 off, and precharge signal $P_2$ falls from +16 to +—12 volts, as represented by event 102a, so that transistor 56 is effectively turned off since node 50 is also at $V_{DD}$. At this stage, it will be noted that precharge signal $P_3$ is still at +16 volts for a short time after transistor 56 is turned off to permit the voltages on digit line $DL_1$ and $\overline{DL_1}$ to precisely equalize through transistors 52 and 54, even though noise in the voltage supply $V_{DD}$ together with unequal capacitive values of the digit lines or unequal conductances of transistors 52 and 54 may have otherwise resulted in unequal voltages on digit lines $DL_1$ and $\overline{DL_1}$, at the instant transistor 56 turned off. Then precharge signal $P_3$ goes to ground, trapping the precisely equal precharge voltages on digit lines $DL_1$ and $\overline{DL_1}$ at a level substantially equal $V_{DD}$, as represented by even 104a. After precharge $P_3$ is at ground, the one row select line identified by the row address signals applied to the chip goes from 0 volts to +12 volts as represented by event 106a. At the same time, the appropriate dummy cell is also addressed. For example, assume row select line $RS_{31}$ is active. In that event, storage cell SD would be enabled by line 66 going from 0 to +12 volts. If a logic "0" is stored in the addressed cell, the voltage on digit line $DL_1$ would drop to a greater extent than the voltage on digit line $\overline{DL_1}$ because of the fact that the capacitance 12 of the storage cell is approximately twice the capacitance of the dummy cell. Since the node 40 is at +16 volts, this change in the voltage on digit lines $DL_1$ and $\overline{DL_1}$ is freely transferred to input nodes 28 and 30 of the different amplifier. However, the latch bus 32 is still one threshold below the precharge voltage of digit line $DL_1$ and $\overline{DL_1}$ so that conductance does not yet occur through either transistor 24 or 26. Next latch signal $L_1$ goes from 0 to +12 volts, thus beginning to slowly discharge the latch bus 32 as represented by event 114a. As the voltage of latch bus 32 begins to fall, transistor 24 begins to conduct before transistor 26 because node 30 has a slightly higher voltage than node 28. As transistor 24 conducts, node 28 is progressively lowered almost as fast as node 32 so that transistor 26 remains essentially off, thus keeping node 30 high and progressively increasing the gate-to-source bias on transistor 24. This condition is greatly assisted by the fact that initially transistor 20 has a low gate voltage with respect to its source voltage and thus provides considerable resistance between node 28 and digit line $DL_1$. Since node 28 has a relatively small capacitance compared to that of digit line $DL_1$, node 28 can be quickly discharged by relatively small currents through transistor 24. After a very short period of time, the differential voltage between nodes 28 and 30 increases substantially and latch signal $L_2$ goes high as represented by event 110a which causes latch bus 32 to discharge at at a much greater rate as represented by event 114b in FIG. 3. As latch node 32 transitions to ground, both transistors 24 and 20 become increasingly more conductive so that digit line $DL_1$ is very rapidly discharged to ground as represented by event 116b. However, digit line $\overline{DL_1}$ remains near $V_{DD}$, typically +11 volts, as represented by event 118b.

Because of the capacitive coupling between node 40 and the digit lines $DL_1$ and $\overline{DL_1}$ provided by the stray capacitance of all the transistors 20 and 22 of all columns as well as the capacitor 46 between node 40 and latch bus node 32, node 40 is also pulled down to approximately +12 volts as digit line $DL_1$ is pulled to ground as represented by event 126a.

If a logic 1 had been stored in the addressed storage cell S, on the other hand, as defined by a voltage in the cell greater than +5.0 volts, then digit line $DL_1$ would have a voltage greater than digit line $\overline{DL_1}$ after the row select signal 106a. This would result in digit line $DL_1$ remaining high as represented by dotted line 116c and digit line $\overline{DL_1}$ would go low as represented by 118c in FIG. 3 when the voltage on the latch bus transitioned low in response to events 108a and 110a of latch signals $L_1$ and $L_2$. It is for this case, i.e., proper sensing of a high stored voltage that the dummy cell is required. Without it, there would be nothing to provide the negative voltage transition on digit line $\overline{DL_1}$ and thus provide the differential voltage necessary for proper sensing.

When the column select line CS goes from 0 to +12 volts as indicated by event 120a, true data bus DB goes from a precharge level of +12 volts to 0 volts as represented by event 122a, assuming that a logic "0" was stored in the addressed cell attached to digit line $DL_1$, and complement data bus $\overline{DB}$ remains at +12 volts as represented by segment 124a. On the other hand, if a logic "1" had been stored in the addressed storage cell attached to the true digit line $DL_1$, then the true data bus DB would remain high as represented by dotted line 122b and the complement data bus $\overline{DB}$ would go to ground as represented by event 124b.

As previously mentioned, the gate of transistor 42 was precharged to $V_{DD}$ during the precharge period while signal $P_3$ was at +16 volts. During the cycle, $P_3$ transitioned to 0 volts, thus turning transistor 44 off and trapping approximately +12 volts on the gate of transistor 42. After node 40 has been discharged to about +12 volts as a result of digit lines $DL_1$ or $\overline{DL_1}$ and node 40 going to ground, latch signal $L_3$ goes from 0 to +12 volts as indicated by event 112a in FIG. 3. This signal is coupled through capacitor 43 to the gate of transistor 42, thus driving the gate substantially above $V_{DD}$ to ensure that node 40 is established at +12 volts as represented at event 126b. In normal operation, this merely overcomes leakage from node 40, but during start up provides the initial +12 volt charge before capacitive boosting occurs as will now be described.

At the end of a cycle, row select line 106 goes to ground at event 106b and column goes to ground at event 120b so that transistors of the addressed storage cell and the addressed dummy cell are turned off and so that column address transistors 60 and 62 are turned off. Latch signal $L_3$ also goes to ground as represented by event 112b, pulling the gate node of transistor 42 back to approximately $V_{DD}$ so that node 40 can be capacitively boosted above $V_{DD}$. Latch signals $L_1$ and $L_2$ also go to ground as represented by events 108b and 110b.

Precharge signals P$_1$ and P$_3$ then go to +12 volts as represented by events 100b and 104b, and precharge signal P$_3$ goes to +16 volts at event 104c, which is approximately two delay stages later than event 104b as a result of the operation of a circuit such as illustrated in FIG. 2. Precharge signal P$_2$ may conveniently transition from +12 volts to +16 volts at the same time as represented by event 102b.

As precharge signal P$_3$ goes positive at event 104b, transistors 52 and 54 turn on so that the digit line DL$_1$ or $\overline{DL_1}$ which has been discharged to ground begins to charge positively as represented by either the solid line 116d or by the dotted line 118d in FIG. 3. This charging continues during the precharge period as precharge signal P$_3$ goes to +16 volts at event 104c and is facilitated by the fact that precharge signal P$_2$ also goes to +16 volts so that node 50 is rapidly charged all the way to V$_{DD}$ of +12 volts. From lines 116 and 118 of FIG. 3, it will be noted that the digit line DL$_1$ or $\overline{DL_1}$ which remained near V$_{DD}$ is initially partially discharged when transistors 52 and 54 are turned on, as represented by events 116e and 118e.

The latch bus 32 is precharged through transistors 20 and 24, and through transistors 22 and 26 of all of the columns to a voltage level one threshold below V$_{DD}$ as represented by event 114c.

Node 40, which is now isolated because transistor 42 was turned off when latch signal L$_3$ went to ground at event 112b, is capacitively boosted back to about +16 volts, as represented by event 126c, because of the stray capacitance of transistors 20 and 22 of all columns and of capacitor 46 which is added to enhance this boosting. It will be appreciated that either the true or complement digit line DL$_1$ or $\overline{DL_1}$ of every column is discharged during each row address cycle so that the combined stray capacitance of 64 transistors contributes to boosting node 40 above V$_{DD}$ as the 64 digit lines are recharged from ground to +12 volts. As a result, node 40 is normally capacitively boosted to about +16 volts during the precharge cycle.

The data buses DB and $\overline{DB}$ are similarly precharged to +12 volts as represented by events 122c and 124c by circuitry which is not illustrated. In the preferred embodiment of the present system, precharge circuitry similar in function to that used to precharge the digit lines DL$_1$ and $\overline{DL_1}$ is also used to precharge the true and complement data buses DB and $\overline{DB}$ and this fact causes the recharge events 122c and 124c to have similar characteristics to the lines illustrating the recharge of lines DL$_1$ and $\overline{DL_1}$.

It should be noted that since the digit line DL$_1$ and $\overline{DL_1}$ start at V$_{DD}$ rather than V$_{DD}$ less one threshold, and since the resistive means minimizes the conduction through one of the cross coupled transistors, the digit line that started at the higher initial voltage normally finishes with a voltage above V$_{DD}$ less one threshold. After completion of a cycle, a cell that started with a voltage just above the minimum level for a logic "1" finishes with a voltage of V$_{DD}$ less one threshold. Conversely, a cell that started with a voltage level just below the maximum level for a logic "0" finishes with a voltage of ground. Thus the act of reading a cell followed by pulling the latch signal to ground refreshes poor logic levels stored in the cell to the optimum logic levels.

From the above detailed description of a preferred embodiment of the present invention, it will be appreciated that an improved latching differential amplifier has been described which will have many applications in MOSFET technology and perhaps in other technologies.

Although preferred embodiments of the invention have been described in detail, it is to be understood that various changes, substitutions and alterations can be made therein without departing from the spirit of the invention as defined by the appended claims.

What is claimed is:

1. The dynamic random access memory comprising an integrated MOSFET circuit including:
   a plurality of storage cells arrayed in rows and columns,
   a sense amplifier for each column,
   a true digit line and a complement digit line for each sense amplifier, the storage cells in each column being connected to at least one of the respective digit lines when the respective storage cells are enabled by a row enable signal;
   row enable means for each row for enabling the storage cells in the respective rows by transferring data stored therein to the digit lines for the respective columns;
   each sense amplifier having true and complement input nodes each having a relatively small capacitance value when compared to the capacitance value of the respective true and complement digit lines, each amplifier including a first transistor connecting the true input node to a latch node and a second transistor connecting the complement input node to the latch node, the gate of the first transistor being part of the complement input node and the gate of the second transistor being part of the true input node;
   first impedance means connecting the true digit line to the true input node, and second impedance means connecting the complement digit line to the complement input node;
   latch node control means for maintaining a precharge on the latch node and then discharging the precharge on the latch node;
   digit line precharge means for precharging the digit lines such that substantially the same precharge voltage level is on both true and complement digit lines; and
   control circuit means for sequentially producing a row enable signal for the storage cells in a selected row to connect the storage cells in the selected row to the respective digit lines and then causing the latch node control means to discharge the latch node whereby one of the digit lines will be discharged and the other not significantly discharged.

2. The combination of claim 1 wherein:
   a true set of dynamic storage cells of each column are connected to the respective true digit line and a corresponding complement set of dynamic storage cells of the column are connected to the respective complement digit line;
   the row enable signal causes the selected cell to transfer a voltage charge to the respective digit line, and further comprising
   means for establishing a reference voltage level on the digit line not connected to a storage cell made active by an address enable signal that is a predetermined value less than the value of the precharge voltage on the digit lines.

3. The combination of claim 1 wherein:

the first and second impedance means are third and fourth transistors, and including bias circuit means biasing the gates of the transistors to a sufficiently high level to permit the precharge voltage levels on the digit lines and the input nodes to equalize.

4. The combination of claim 3 wherein the bias circuit means comprises:

means interconnecting the gates of the third and fourth transistors of at least one column to form a common node, and means for precharging the common node and then isolating the common node before the digit lines are precharged whereby the common node will be capacitively boosted more than a threshold above the precharge voltage of the digit lines at least in part by the stray capacitance of the third and fourth transistors.

5. The combination of claim 4 wherein:

the integrated circuit has a drain supply voltage that is the maximum externally applied supply voltage; and the digit line precharge means drives the digit lines to a precharge voltage substantially equal to the drain supply voltage.

6. The combination of claim 5 wherein the digit line precharge means comprises:

first precharge means for conneting a first precharge node to a voltage supply in response to a first precharge signal; and second and third precharge means for connecting the first precharge node to the true and complement digit lines respectively, in response to a second precharge signal, whereby the true and complement digit lines voltages may equalize when the first precharge signal is off and the second precharge signal is on.

7. The combination of claim 6 wherein the digit line precharge means further comprises:

precharge control means for terminating the first precharge signal before the second precharge signal whereby the precharge voltages on the digit lines may equalize after the first precharge node is disconnected from the voltage supply.

8. The combination of claim 6 wherein:

the latch node control means comprises means for discharging the latch node at a progressively increasing rate.

9. The combination of claim 2 wherein:

the first and second impedance means are third and fourth transistors, and including bias circuit means biasing the gates of the transistors to a sufficiently high level to permit the precharge voltage levels on the digit lines and the input nodes to equalize.

10. The combination of claim 9 wherein the bias circuit means comprises:

means interconnecting the gates of the third and fourth transistors of at least one column to form a common node, and means for precharging the common node and then isolating the common node before the digit lines are precharged whereby the common node will be capacitively boosted more than a threshold above the precharge voltage of the digit lines at least in part by the stray capacitance of the third and fourth transistors.

11. The combination of claim 1 wherein:

the integrated circuit has a drain supply voltage that is the maximum externally applied supply voltage; and the digit line precharge means drives the digit lines to a precharge voltage substantially equal to the drain supply voltage.

12. The combination of claim 11 wherein the digit line precharge means comprises:

first precharge means for connecting a first precharge node to the drain supply voltage in response to a first precharge signal; and second and third precharge means for connecting the first precharge node to the true and complement digit lines respectively, in response to a second precharge signal, whereby the precharge voltages on the true and complement digit line may equalize when the first precharge signal is off and the second precharge signal is on.

13. The combination of claim 12 wherein the digit line precharge means further comprises:

precharge control means for terminating the first precharge signal before the second precharge signal whereby the precharge voltages on the digit lines may equalize after the first precharge node is disconnected from the voltage supply.

14. The combination of claim 1 wherein:

the latch node control means comprises means for discharging the latch node at a progressively increasing rate.

15. In a dynamic random access memory having a plurality of storage cells arrayed in rows and columns with a true digit line and a complement digit line for each column, the cells of each column being connectable to the respective true and complement digit lines when each respective row of storage cells is enabled by a row enable signal to transfer a differential voltage signal to the respective digit lines, the method of determining the logic value stored in a selected storage cell from the differential voltage applied to the digit lines comprising:

precharging the true and complement digit lines and true and complement input nodes having substantially smaller capacitance values than the digit lines to equal predetermined voltage levels and storing the precharge voltage level thereon;

connecting a storage cell to at least one of the digit lines by a row enable signal to reduce the precharge voltage on the digit line and the corresponding input node by a small value determined by the logic level stored in the storage cell, while reducing the precharge voltage on the other digit line and the other corresponding input node by a predetermined reference value; then discharging either the true input node through a first transistor the conductance of which is controlled by the voltage on the complement input node while also discharging the voltage on the true digit line through a first impedance to the true input node, or in the alternative, discharging the complement input node through a second transistor the conductance of which is controlled by the voltage on the true input node while also discharging the voltage on the complement digit line through a second impedance to the complement input node.

16. The dynamic random access memory comprising an integrated MOSFET circuit including:

a plurality of dynamic storage cells arrayed in rows and columns and each cell having a capacitive storage node, a true digit line and a complement digit line for each column, the storage nodes on one portion of the storage cells in each column being connected to the respective true digit line and the storage nodes of the remainder of the storage cells in the respective column being connected to the respective complement digit line when the respective storage cells are enabled by a row enable signal, row enable means for each row for enabling the storage cells in the respective rows in response to a row address signal, means for establishing a reference voltage level on the digit lines not connected to a storage cell by an address enable signal that is a predetermined value less than the value of the precharge voltage on the digit lines, a sense amplifier having true and complement input nodes each having a relatively small capacitance value when compared to the capacitance value of the true and complement digit lines, the amplifier including a first transistor connecting the true input node to a latch node and a second transistor connecting the complement input node to the latch node, the gate of the first transistor being part of the complement input node and the gate of the second transistor being part of the true input node, a third transistor connecting the true digit line to the true input node and a fourth transistor connecting the complement digit line to the complement input node, bias circuit means biasing the gates of the third and fourth transistors to a sufficiently high level to permit the precharge voltage levels on the digit lines and the input nodes to substantially equalize, latch node control means for maintaining a precharge on the latch node and then discharging the precharge on the latch node, digit line precharge means for precharging the digit lines to predetermined voltage levels and the latch node to a voltage level sufficiently high to substantially prevent conductance of the first and second transistors, and control circuit means for sequentially producing a row enable signal for the storage cells in a row to connect the storage cells to the respective digit lines and then causing the latch node control means to discharge the latch node whereby one of the digit lines will be discharged and the other not substantially discharged.

17. The combination of claim 16 wherein the bias circuit means comprises:

means interconnecting the gates of the third and fourth transistors of at least one column to form a common node, and means for precharging the common node and then isolating the common node before the digit lines are precharged whereby the common node will be capacitively boosted more than a threshold above the precharge voltage of the digit lines at least in part by the stray capacitance of the third and fourth transistors.

18. The combination of claim 17 wherein:

the integrated circuit has a drain supply voltage that is the maximum externally applied supply voltage, and the digit line precharge means drives the digit lines to a precharge voltage substantially equal to the drain supply voltage.

19. The combination of claim 18 wherein the digit line precharge means comprises:

first precharge means for connecting a first precharge node to a voltage supply in response to a first precharge signal, second and third precharge means for connecting the first precharge node to the true and complement digit lines respectively, in response to a second precharge signal, and precharge control means for terminating the first precharge signal before the second precharge signal whereby the precharge voltages on the digit lines may equalize after the first precharge node is disconnected from the voltage supply.

20. The combination of claim 19 wherein:

the latch node control means comprises means for discharging the latch node at a progressively greater rate.

* * * * *

UNITED STATES PATENT AND TRADEMARK OFFICE
CERTIFICATE OF CORRECTION

PATENT NO. : 4,061,999

DATED : December 6, 1977

INVENTOR(S) : Robert J. Proebsting and Paul R. Schroeder

It is certified that error appears in the above-identified patent and that said Letters Patent are hereby corrected as shown below:

In the Abstract, Line 16, between "other" and "line" insert -- digit --.

Column 4, Line 20, after "U.S. Pat. No." delete "3,969,706" and insert - - - 4,061,933 - - -.

Column 4, Line 54, after "time" insert - - - line - - -, and change "voltage" to read - - - voltages - - -.

Column 5, Line 17, before "12 volts" delete - - - ___ - - -.

Column 5, Line 31, change "even" to read - - - event - - -.

Column 5, Line 46, change "different" to read - - - differential - - -.

Column 6, Line 60, after "column" insert - - - select - - -.

Signed and Sealed this

First Day of August 1978

[SEAL]

Attest:

RUTH C. MASON
*Attesting Officer*

DONALD W. BANNER
*Commissioner of Patents and Trademarks*